United States Patent
Morita et al.

(10) Patent No.: US 10,302,735 B2
(45) Date of Patent: May 28, 2019

(54) WIRELESS TERMINAL ANTENNA DIRECTIONAL CHARACTERISTIC MEASUREMENT SYSTEM AND WIRELESS TERMINAL ANTENNA DIRECTIONAL CHARACTERISTIC MEASUREMENT METHOD

(71) Applicant: ANRITSU CORPORATION, Kanagawa (JP)

(72) Inventors: Tomonori Morita, Kanagawa (JP); Aya Yamamoto, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 0 days.

(21) Appl. No.: 15/957,151

(22) Filed: Apr. 19, 2018

(65) Prior Publication Data

US 2018/0329017 A1 Nov. 15, 2018

(30) Foreign Application Priority Data

May 11, 2017 (JP) ................................ 2017-094536

(51) Int. Cl.
*G01S 3/38* (2006.01)
*H04W 64/00* (2009.01)
(Continued)

(52) U.S. Cl.
CPC ................ *G01S 3/38* (2013.01); *G01R 29/10* (2013.01); *H01Q 1/1257* (2013.01); *H04W 4/80* (2018.02);
(Continued)

(58) Field of Classification Search
CPC combination set(s) only.
See application file for complete search history.

(56) References Cited

U.S. PATENT DOCUMENTS

| 4,968,983 A * | 11/1990 | Maeda | G01R 29/0878 |
|---|---|---|---|
| | | | 342/360 |
| 2006/0194553 A1* | 8/2006 | Ozaki | G01R 29/10 |
| | | | 455/226.1 |

(Continued)

OTHER PUBLICATIONS

The Institute of Electronics, Information and Communication Engineers, pp. 439-446, First edition Fifth issue of Antenna Engineering Handbook issued by Ohmsha on Dec. 30, 1989, Cited in Specification.
(Continued)

*Primary Examiner* — Junpeng Chen
(74) *Attorney, Agent, or Firm* — Pearne & Gordon LLP (57) ABSTRACT

A directional characteristic acquisition unit 51 rotates a wireless terminal 1 that is a measurement target using a terminal holding rotation mechanism 30 centering around a standard point O, measures a field intensity Pr of a radio wave received by the measurement antenna 21 at each rotation angle ($\phi$, $\theta$) to calculate a virtual directional characteristic of a terminal antenna 1a in the wireless terminal 1. An error information output unit 60 calculates a reception angle error ($\phi'$, $\theta'$), a propagation loss error E1, and a gain error E2 that occur in accordance with rotation of the wireless terminal 1, and corrects a virtual directional characteristic using these errors, using a correction unit 70, to calculate a directional characteristic Hc in a case where it is assumed that the terminal antenna 1a of the wireless terminal 1 is rotated at the position of the standard point O.

19 Claims, 7 Drawing Sheets

(51) Int. Cl.
*H04W 4/80* (2018.01)
*H01Q 1/12* (2006.01)
*G01R 29/10* (2006.01)
*H04B 17/10* (2015.01)

(52) U.S. Cl.
CPC ......... *H04W 64/006* (2013.01); *H04B 17/104* (2015.01)

(56) References Cited

U.S. PATENT DOCUMENTS

| | | | | |
|---|---|---|---|---|
| 2006/0269020 | A1* | 11/2006 | Vicharelli | H01Q 1/00 375/345 |
| 2008/0129615 | A1* | 6/2008 | Breit | G01R 29/105 343/703 |
| 2010/0302101 | A1* | 12/2010 | Leiba | H01Q 1/1257 342/359 |
| 2018/0054294 | A1* | 2/2018 | Rappaport | H04B 17/104 |

OTHER PUBLICATIONS

The Institute of Electronics, Information and Communication Engineers, pp. 1534, First edition First issue of Electronic Information Handbook issued by Ohmsha on Mar. 30, 1979, Cited in Specification.

\* cited by examiner

| | | $\theta 1$ | $\theta 2$ | ---- | $\theta n$ |
|---|---|---|---|---|---|
| A1 | $\phi 1$ | E0(1,1,1)<br>E1(1,1,1)<br>E2(1,1,1) | E0(1,2,1)<br>E1(1,2,1)<br>E2(1,2,1) | ---- | E0(1,n,1)<br>E1(1,n,1)<br>E2(1,n,1) |
| | $\phi 2$ | E0(2,1,1)<br>E1(2,1,1)<br>E2(2,1,1) | E0(2,2,1)<br>E1(2,2,1)<br>E2(2,2,1) | ---- | E0(2,n,1)<br>E1(2,n,1)<br>E2(2,n,1) |
| | --- | ---- | ---- | ---- | ---- |
| | $\phi m$ | E0(m,1,1)<br>E1(m,1,1)<br>E2(m,1,1) | E0(m,2,1)<br>E1(m,2,1)<br>E2(m,2,1) | ---- | E0(m,n,1)<br>E1(m,n,1)<br>E2(m,n,1) |
| | | $\theta 1$ | $\theta 2$ | ---- | $\theta n$ |
| A2 | $\phi 1$ | E0(1,1,2)<br>E1(1,1,2)<br>E2(1,1,2) | E0(1,2,2)<br>E1(1,2,2)<br>E2(1,2,2) | ---- | E0(1,n,2)<br>E1(1,n,2)<br>E2(1,n,2) |
| | $\phi 2$ | E0(2,1,2)<br>E1(2,1,2)<br>E2(2,1,2) | E0(2,2,2)<br>E1(2,2,2)<br>E2(2,2,2) | ---- | E0(2,n,2)<br>E1(2,n,2)<br>E2(2,n,2) |
| | --- | ---- | ---- | ---- | ---- |
| | $\phi m$ | E0(m,1,2)<br>E1(m,1,2)<br>E2(m,1,2) | E0(m,2,2)<br>E1(m,2,2)<br>E2(m,2,2) | ---- | E0(m,n,2)<br>E1(m,n,2)<br>E2(m,n,2) |

FIG. 7

| Distance between antennas (m) | Free space propagation loss (dB) | | |
|---|---|---|---|
| | 800MHz | 2GHz | 28GHz |
| 0.5 | 24.5 | 32.4 | 55.4 |
| 1.0 | 30.5 | 38.5 | 61.4 |
| 3.0 | 40.0 | 48.0 | 70.9 |
| 5.0 | 44.5 | 52.4 | 75.4 |
| 10.0 | 50.5 | 58.5 | 81.4 |

FIG. 8

WIRELESS TERMINAL ANTENNA DIRECTIONAL CHARACTERISTIC MEASUREMENT SYSTEM AND WIRELESS TERMINAL ANTENNA DIRECTIONAL CHARACTERISTIC MEASUREMENT METHOD

TECHNICAL FIELD

The present invention relates to a technique for accurately measuring a far field directional characteristic of an antenna of a wireless terminal such as a mobile phone, a smartphone, a tablet, or a wireless router.

BACKGROUND ART

Compared to a frequency (for example, 800 MHz, 2000 MHz, or the like) used in a wireless terminal called a third generation or a fourth generation, a millimeter-wave band such as 24.25 GHz, 28 GHz, or 39 GHz has been determined to be allocated to a frequency to be used in the next generation (a fifth generation), and accordingly, a technique for measuring a directional characteristic of an antenna of a wireless terminal that uses the millimeter-wave band is necessary.

Generally, measurement of a directional characteristic of an antenna refers to measurement of a field intensity or the magnitude of radiation power (hereinafter, referred to as a radio wave intensity) in a far field, in which a distance condition of the far field is measured in a state where a distance R between transmission and reception antennas satisfies the following condition.

$$R \geq 2D^2/\lambda,$$

Here, $\lambda$ represents a free space wavelength (m) of a radio wave to be used, and D represents a larger diameter (m) among maximum diameters of openings of the transmission and reception antennas.

In a case where D is set to four times the wavelength $\lambda$, $R \geq 2D^2/\lambda = \lambda(16\lambda^2)/\lambda = 32\lambda$, and in a case where the frequency of a radio wave is set to 30 GHz, $\lambda=10$ mm, and the distance R necessary for far field measurement becomes equal to or longer than 32 cm.

In the case of real far field measurement, under an environment such as a radio free-field room, in a state where transmission and reception antennas are spaced from each other by the distance R and a radio wave is transmitted or received to be able to measure the radio wave intensity, one antenna that is a measurement target fixed to a rotatable antenna installation unit is rotated, for example, in a horizontal direction and a vertical direction centering around a phase center thereof at a predetermined angle step, and the radio wave intensity is measured at each rotation angle, and thus, a directional characteristic of the one antenna is calculated in all directions.

A phase center of an antenna refers to a point that is virtually considered as a radio wave concentration point in emission and incidence of a radio wave, and its position depends on the type of the antenna. For example, in the case of a dipole antenna, a point in the vicinity of a power supply point becomes a phase center. In the case of a horn antenna, a phase center is positioned on a slightly inner side of a horn on a central line of a horn opening portion. In an ideal antenna, a phase center is determined as a single point, but in a real antenna, such points are scattered due to various reasons. Here, an average position thereof is defined as an antenna phase center, and it is considered that the position scattering of the phase center of the antenna itself is enough small to be ignored compared with other errors of a measurement system. Further, in the following description, "the position of an antenna" does not represent a physical position antenna having a stereoscopic or planar extension, but represents a phase center that serves as an electric function of an antenna, unless otherwise mentioned.

The above-mentioned distance condition of the far field measurement is disclosed in the following Non-Patent Documents 1 and 2, for example.

RELATED ART DOCUMENT

Non-Patent Document

[Non-Patent Document 1] The Institute of Electronics, Information and Communication Engineers, pp. 439-446, First edition Fifth issue of Antenna Engineering Handbook issued by Ohmsha on Dec. 30, 1989

[Non-Patent Document 2] The Institute of Electronics, Information and Communication Engineers, pp. 1534, First edition First issue of Electronic Information Handbook issued by Ohmsha on Mar. 30, 1979

DISCLOSURE OF THE INVENTION

Problem that the Invention is to Solve

In recent years, a terminal antenna of a wireless terminal such as a mobile phone or a smartphone has been provided in a terminal housing. In this regard, there is no problem as long as the wireless terminal is disposed so that the position of the terminal antenna (strictly speaking, the above-mentioned phase center, which is similarly applied hereinafter) matches a rotation center of a terminal holding rotation mechanism for holding and rotating the wireless terminal. However, wireless terminals that are test targets have different appearances and sizes according to models, and there no uniformity in positions of terminal antennas provided therein.

Accordingly, in order to perform measurement of these various types of wireless terminals, the wireless terminals need to be disposed so that the positions of the terminal antennas match the rotation center of the terminal holding rotation mechanism. For example, an extremely complicated large-scale positioning mechanism such as an XYZ stage is necessary. Further, the influence on a radio wave due to provision of the positioning mechanism in the vicinity of the wireless terminals is unavoidable.

As a method for solving this problem, a method for setting a distance R from a rotation center to a directional characteristic measurement antenna to be sufficiently long with respect to a distance from a rotation center of a terminal holding rotation mechanism to a terminal antenna, and reducing the influence on measurement due to deviation of the position of the terminal antenna from the rotation center may be considered. For example, in a case where the distance R is set to several meters that are sufficiently long with respect to the distance from the rotation center to the terminal antenna (about maximum 10 millimeters in a general wireless terminal such as a smartphone), it is possible to greatly reduce the influence on measurement due to deviation of the position of the terminal antenna from the rotation center.

Figure 8:
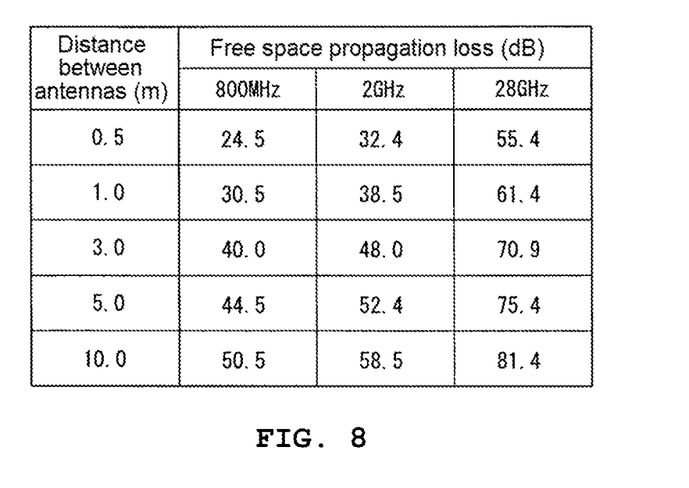
FIG. 8 is a diagram showing a free space propagation loss with respect to a frequency.

However, as shown in FIG. 8, compared with a 800 MHz band or a 2 GHz band, a propagation loss in a free space of millimeter-wave band (28 GHz) is noticeably large, and in a case where the distance R is set to several meters or longer as described above, the propagation loss becomes 70 dB or larger, which makes it difficult to perform measurement of a directional characteristic with high accuracy.

In order to solve the above-mentioned problems, an object of the invention is to provide a wireless terminal antenna directional characteristic measurement system and a wireless terminal antenna directional characteristic measurement method capable of measuring an accurate directional characteristic without influence on measurement due to deviation of the position of a terminal antenna from a rotation center of a terminal holding rotation mechanism, even in a case where a distance between a wireless terminal that is a test target and a measurement antenna is a relatively short distance in which a far field measurement condition is satisfied and a propagation loss therebetween does not become large.

Means for Solving the Problem

In order to achieve the above object, according to a first aspect of the invention, there is provided a wireless terminal antenna directional characteristic measurement system including: a measurement antenna (21) having a known directional characteristic, which is fixed at a predetermined position in a measurement space in which entrance of a radio wave from the outside and internal reflection of the radio wave are suppressed; a terminal holding rotation mechanism (30) that holds, using a point spaced from a phase center of the measurement antenna by a predetermined distance as a standard point, a wireless terminal (1) that is a measurement target in a vicinity of the standard point, and rotates the held wireless terminal centering around the standard point within a region where distance condition of far field measurement is satisfied from the measurement antenna, in the measurement space; a radio wave intensity measurement unit (40) that measures a field intensity or power of a radio wave received by the measurement antenna with respect to a radio wave output from a terminal antenna in the wireless terminal held by the terminal holding rotation mechanism; a directional characteristic acquisition unit (51) that rotates the wireless terminal from a standard position by controlling the terminal holding rotation mechanism and acquires a virtual directional characteristic of the terminal antenna from a measurement value obtained by the radio wave intensity measurement unit at each rotation angle; an antenna position input unit (52) through which the position of the terminal antenna in a case where the wireless terminal is disposed in the standard position, in the measurement space, is input; an error information output unit (60, 60') that outputs a reception angle error at each rotation angle of the wireless terminal indicating a deviation between a direction of the standard point and a direction of the terminal antenna from the phase center of the measurement antenna, a propagation loss error in a free space at each rotation angle of the wireless terminal, which occurs due to a difference between a distance to the standard point from the phase center of the measurement antenna and a distance to the terminal antenna, and a gain error of the measurement antenna at each rotation angle of the wireless terminal, which is determined by the reception angle error and the directional characteristic of the measurement antenna, on the basis of the input position of the terminal antenna; and a correction unit (70) that corrects the virtual directional characteristic of the terminal antenna using the reception angle error, the propagation loss error, and the gain error at each rotation angle of the wireless terminal output from the error information output unit to calculate a directional characteristic in a case where it is assumed that the terminal antenna is rotated at the position of the standard point.

According to a second aspect of the invention, in the wireless terminal antenna directional characteristic measurement system according to the first aspect of the invention, the error information output unit includes a reception angle error calculation unit (61) that calculates the reception angle error at each rotation angle of the wireless terminal on the basis of the input position of the terminal antenna, a propagation loss error calculation unit (62) that calculates the propagation loss error in the free space at each rotation angle of the wireless terminal on the basis of the input position of the terminal antenna, and a gain error calculation unit (63) that calculates the gain error of the measurement antenna at each rotation angle of the wireless terminal from the reception angle error at each rotation angle of the wireless terminal calculated the reception angle error calculation unit and the directional characteristic of the measurement antenna.

According to a third aspect of the invention, in the wireless terminal antenna directional characteristic measurement system according to the first aspect of the invention, the error information output unit includes a reception angle error storage unit (65) that stores, in a state where a plurality of candidate positions capable of becoming the position of the terminal antenna in a case where the wireless terminal that is the measurement target candidate is disposed at the standard position are set in the measurement space, the reception angle error at each rotation angle of the wireless terminal that is calculated in advance with respect to each of the plurality of candidate positions, a propagation loss error storage unit (66) that stores the propagation loss error in the free space at each rotation angle of the wireless terminal that is calculated in advance, with respect to each of the plurality of candidate positions, a gain error storage unit (67) that stores the gain error of the measurement antenna at each rotation angle of the wireless terminal that is calculated in advance using the reception angle error stored in the reception angle error storage unit and the directional characteristic of the measurement antenna with respect to each of the plurality of candidate positions, and an error information read-out unit (68) that reads out the reception angle error, the propagation loss error, and the gain error at each rotation angle of the wireless terminal that are stored in advance in the reception angle error storage unit, the propagation loss error storage unit, and the gain error storage unit with respect to a candidate position corresponding to the position input through the antenna position input unit among the plurality of candidate positions, and provides the result to the correction unit.

According to a fourth aspect of the invention, in the wireless terminal antenna directional characteristic measurement system according to the first aspect of the invention, the phase center is a point that is virtually considered as a concentration point of a radio wave in emission and incidence of the radio wave.

According to a fifth aspect of the invention, in the wireless terminal antenna directional characteristic measurement system according to the second aspect of the invention, the phase center is a point that is virtually considered as a concentration point of a radio wave in emission and incidence of the radio wave.

According to a sixth aspect of the invention, in the wireless terminal antenna directional characteristic measurement system according to the third aspect of the invention, the phase center is a point that is virtually considered as concentration point of a radio wave in emission and incidence of the radio wave.

According to a seventh aspect of the invention, in the wireless terminal antenna directional characteristic measurement system according to the first aspect of the invention, a frequency used in the wireless terminal is a millimeter-wave band.

According to an eighth aspect of the invention, in the wireless terminal antenna directional characteristic measurement system according to the second aspect of the invention, a frequency used in the wireless terminal is a millimeter-wave band.

According to a ninth aspect of the invention, in the wireless terminal antenna directional characteristic measurement system according to the third aspect of the invention, a frequency used in the wireless terminal is a millimeter-wave band.

According to a tenth aspect of the invention, in the wireless terminal antenna directional characteristic measurement system according to the fourth aspect of the invention, a frequency used in the wireless terminal is a millimeter-wave band.

According to an eleventh aspect of the invention, in the wireless terminal antenna directional characteristic measurement system according to the fifth aspect of the invention, a frequency used in the wireless terminal is a millimeter-wave band.

According to a twelfth aspect of the invention, in the wireless terminal antenna directional characteristic measurement system according to the sixth aspect of the invention, a frequency used in the wireless terminal is a millimeter-wave band.

According to a thirteenth aspect of the invention, there is provided a wireless terminal antenna directional characteristic measurement method including: a step of rotating, using a point spaced by a predetermined distance from a phase center of a measurement antenna (21) having a known directional characteristic, which is fixed at a predetermined position in a measurement space in which entrance of a radio wave from the outside and internal reflection of the radio wave are suppressed, as a standard point, a wireless terminal (1) that is a measurement target held in the vicinity of the standard point centering around the standard point from a standard position within a region where a distance condition of far field measurement is satisfied from the measurement antenna, and measuring a field intensity or power of a radio wave received by the measurement antenna with respect to the radio wave output from a terminal antenna in the wireless terminal at each rotation angle to acquire a virtual directional characteristic of the terminal antenna; a step of inputting the position of the terminal antenna in a case where the wireless terminal is disposed in the standard position, in the measurement space; a step of outputting respective errors including a reception angle error at each rotation angle of the wireless terminal indicating a deviation between a direction of the standard point and a direction of the terminal antenna from the phase center of the measurement antenna, a propagation loss error in a free space at each rotation angle of the wireless terminal, which occurs due to a difference between a distance to the standard point from the phase center of the measurement antenna and a distance to the terminal antenna, and a gain error of the measurement antenna at each rotation angle of the wireless terminal, which is determined by the reception angle error and the directional characteristic of the measurement antenna, on the basis of the input position of the terminal antenna; and a step of correcting the virtual directional characteristic of the terminal antenna using the output reception angle error, propagation loss error, and gain error at each rotation angle of the wireless terminal to calculate a directional characteristic in a case where it is assumed that the terminal antenna is rotated at the position of the standard point.

According to a fourteenth aspect of the invention, in the wireless terminal antenna directional characteristic measurement method according to the thirteenth aspect of the invention, the step of outputting the respective errors includes calculating the reception angle error, the propagation loss error, and the gain error at each rotation angle of the wireless terminal by computation using the input position of the terminal antenna.

According to a fifteenth aspect of the invention, the wireless terminal antenna directional characteristic measurement method according to the thirteenth aspect of the invention further includes: a step of setting a plurality of candidate positions capable of becoming the position of the terminal antenna in a case where the wireless terminal that is the measurement target candidate is disposed at the standard position in the measurement space, and calculating and storing in advance the reception angle error, the propagation loss error in the free space, and the gain error of the measurement antenna at each rotation angle of the wireless terminal with respect to each of the plurality of candidate positions, in which the step of outputting the respective errors includes reading out the reception angle error, the propagation loss error, and the gain error that are stored in advance with respect to a candidate position corresponding to the input position of the terminal antenna among the plurality of candidate positions.

Advantage of the Invention

As described above, according to the invention, a wireless terminal that is a measurement target is rotated centering around a standard point, a field intensity or power of a radio wave received by a measurement antenna is measured at each rotation angle to calculate a virtual directional characteristic of a terminal antenna in the wireless terminal, and the virtual directional characteristic is corrected using a reception angle error, a propagation loss error, and a gain error that occur in accordance with rotation of the wireless terminal, and thus, a directional characteristic in a case where it is assumed that the terminal antenna of the wireless terminal is rotated at the position of the standard point is calculated.

Thus, even in a case where a distance between a wireless terminal that is a test target and a measurement antenna is a relatively short distance in which a far field measurement condition is satisfied and a propagation loss therebetween does not become large, it is possible to accurately measure directional characteristic without influence on measurement due to deviation of the position of the terminal antenna from a rotation center.

BEST MODE FOR CARRYING OUT THE INVENTION

Hereinafter, embodiments of the invention will be described with reference to the accompanying drawings.

Figure 1:
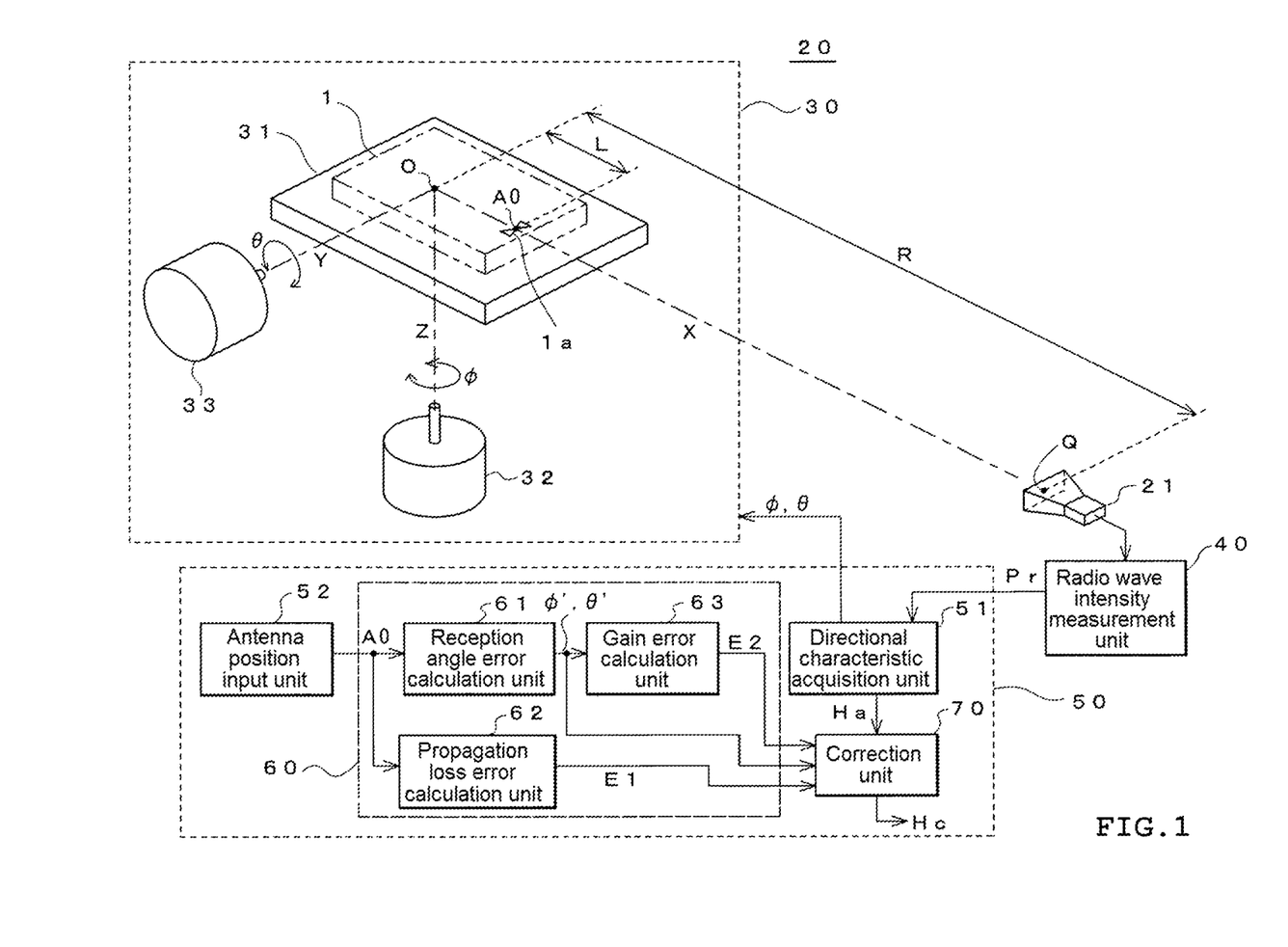
FIG. 1 is an overall configuration diagram of an embodiment of the invention.

FIG. 1 shows a configuration of an antenna directional characteristic measurement system (hereinafter, simply referred to as a measurement system) 20 according to an embodiment of the invention.

The measurement system 20 includes a measurement antenna 21, a terminal holding rotation mechanism 30, a radio wave intensity measurement unit 40, and a computational processing unit 50 of a computer configuration.

The measurement antenna 21 refers to an antenna having a known directional characteristic, which is fixed at a predetermined position in a measurement space (not shown) in which entrance of a radio wave from the outside and internal reflection of the radio wave are suppressed, and receives a radio wave output from the wireless terminal 1 that is a measurement target that is similarly disposed in the measurement space. In a millimeter-wave band, various antennas such as a horn antenna as shown in FIG. 1, or an antenna (for example, a tapered slot antenna) in which an antenna element is patterned on a printed board may be used.

The terminal holding rotation mechanism 30 holds, using a point spaced from a phase center Q of the measurement antenna 21 by a predetermined distance R in a standard direction (which is normally a maximum gain direction perpendicular to an opening) of a directional characteristic as a standard point O, the wireless terminal 1 that is a measurement target in the vicinity of the standard point O, and rotates the held wireless terminal 1 centering around the standard point O within a region where a distance condition of far field measurement is satisfied from the measurement antenna 21, in the measurement space.

In this embodiment, it is assumed that the measurement space is represented by an XYZ orthogonal coordinate system using the standard point O as the original, and it is assumed that the phase center Q of the measurement antenna 21 is disposed on an X-axis, a Z-axis represents a vertical direction in FIG. 1, and a Y-axis represents a direction orthogonal to the X-axis and the Z-axis. The terminal holding rotation mechanism 30 has a structure in which the held wireless terminal is rotated, centering around the standard point O, around at least the Z-axis and the Y-axis among the three orthogonal axes X, Y, and Z. A three-axis structure in which the held wireless terminal is also rotated around the X-axis may be used.

As described above, herein, the measurement space is represented by the XYZ orthogonal coordinate system using the standard point O as the origin, but an origin position of a coordinate system for defining the measurement space is arbitrary. For example, the phase center Q of the measurement antenna 21 or the like may be used as the origin instead of the standard point O. Alternatively, instead of the orthogonal coordinate system, a polar coordinate system in which the standard point O, the phase center Q of the measurement antenna 21, or the like is used as the origin may be used.

A specific mechanism of the terminal holding rotation mechanism 30 will not be described in detail, but for example, as shown in FIG. 1, any arbitrary mechanism for rotating a holding stand 31 that holds the wireless terminal 1 around the Z-axis and the Y-axis using rotation devices 32 and 33 such as a stepping motor or a servo motor centering around the standard point O at a predetermined angle step may be used. Control of the rotation angle is controlled by the computational processing unit 50. As a material and the shape of the holding stand 31, a material and a shape that less affect a radiation characteristic of an antenna of the wireless terminal 1 including the holing mechanism are used.

The radio wave intensity measurement unit 40 measures a field intensity Pr indicating the intensity of a radio wave received by the measurement antenna 21 with respect to a radio wave output from a terminal antenna 1a of the wireless terminal 1 held in the terminal holding rotation mechanism 30, and outputs the result to the computational processing unit 50. In the following description, a field intensity is used as a measurement value indicating the intensity of a radio wave, but instead of the field intensity, power of a received wave may be measured. Specifically, the radio wave intensity measurement unit 40 may be configured by a power meter, an ammeter, or the like.

The computational processing unit 50 executes a variety of controls and computational processing necessary for the measurement system 20, but herein, performs a process of acquiring the field intensity Pr obtained by the radio wave intensity measurement unit 40 at each rotation angle of the wireless terminal 1 by controlling the terminal holding rotation mechanism 30 to calculate a virtual directional characteristic, a process of calculating various errors of a measurement system due to a position change of a terminal antenna that accompanies rotation of the wireless terminal 1, and a process of performing correction corresponding to these errors to calculate a true directional characteristic of the terminal antenna 1a. The computational processing unit 50 is configured by software by executing a predetermined program with respect to the respective processes.

A directional characteristic acquisition unit 51 of the computational processing unit 50 rotates the wireless terminal 1 from a standard position by controlling the terminal holding rotation mechanism 30, acquires a field intensity $Pr(\phi, \theta)$ measured by the radio wave intensity measurement unit 40 at each rotation angle $(\phi, \theta)$, and calculates a virtual directional characteristic $Ha(\phi, \theta)$ of the terminal antenna 1a of the wireless terminal 1. Here, a specific rotation control with respect to the terminal holding rotation mechanism 30 is performed by receiving a measurement starting instruction through an operating unit (not shown) or the like and rotating the wireless terminal 1 held in the holding stand 31 of the terminal holding rotation mechanism 30 around the Z-axis and the Y-axis centering around the standard point O from the standard position (standard posture) by predetermined steps $\Delta\phi$ and $\Delta\theta$, respectively. Further, herein, with respect to the rotation angle $\phi$ around the Z-axis, the rotation is performed by the $\Delta\phi$ step in a range of 0° to 360° (0°±180°), and with respect to the rotation angle $\theta$ around the Y-axis, the rotation is performed by the $\Delta\theta$ in a range of 0° to 180° (0°±90°). Thus, all directions are covered centering around the standard point O. The directional characteristic acquisition unit 51 is configured in a software form by executing a predetermined program. The operating unit is used for performing an operation input from a user, and includes an input device such as a keyboard, a touch panel, or a mouse.

The order of the rotation controls is arbitrary, but for example, an operation of changing one rotation angle by one step and then changing the other rotation angle by a predetermined number of steps, for example, 360° (or ±180°) is repeated. In a case where one step is set to $\Delta\phi=\Delta\theta=5°$, the position of the terminal antenna 1a is located at 2522 points obtained by adding two upper and lower polar points to a product of 360/5=72 points around the Z-axis and 180/5−1=35 points obtained by excluding $\theta=\pm90°$ (two upper and lower polar points) points around the Y-axis.

Further, herein, as shown in FIG. 1, in order to apply a coordinate conversion formula (which will be described later), a state where a terminal holding surface of the holding stand 31 is parallel to an XY plane, a display operating surface of the wireless terminal 1 is held to be in an approximately horizontal state (sleeping state) on the terminal holding surface, and the terminal antenna 1a in the wireless terminal 1 is disposed on the X-axis and is disposed at a position closest to the measurement antenna 21 is set as the standard position. In this case, the standard point O is disposed on a line that passes through a position higher than the terminal holding surface of the holding stand 31, and is disposed in the wireless terminal, in many cases. In a case where a state where the position of the terminal antenna 1a is disposed at a position higher than the X-axis (or a position lower than the X-axis) is set as the standard position, by performing offset correction the rotation angle θ around the Y-axis at an angle associated with a deviation in the height direction, it is possible to apply the coordinate conversion formula (which will be described later). Further, the standard position of the wireless terminal 1 is set to specifying the posture of the wireless terminal 1 in starting the measurement, and is not limited to the above-described position. Instead of the state where the display operating surface of the wireless terminal 1 is parallel to the XY plane (sleeping state), a state where the display operating surface of the wireless terminal 1 is parallel to a YZ plane (standing state) or a state where the display operating surface of the wireless terminal 1 is parallel to an XZ plane may be set as the standard position (standard posture).

In an ideal state where the position of the terminal antenna 1a is disposed at the standard point O, the virtual directional characteristic Ha(φ, θ) obtained by the directional characteristic acquisition unit 51 accurately shows a directional characteristic of the terminal antenna 1a, but in reality, since the position of the terminal antenna 1a is not present at the standard point O, an error occurs. Thus, as units for preventing this error, an antenna position input unit 52, an error information output unit 60, and a correction unit 70 are provided in the computational processing unit 50.

The antenna position input unit 52 is used for inputting coordinates for specifying the position of the terminal antenna 1a in a case where the wireless terminal 1 is disposed in the standard position in the measurement space represented by the XYZ orthogonal coordinate system using the standard point O as the origin. For example, coordinates (hereinafter, referred to as initial coordinates) A0=(X, Y, Z) of the terminal antenna 1a in a case where the wireless terminal 1 is held at the standard position are input from a tester using an operating unit (not shown) or the like. As described above, in a case where the state where the terminal holding surface of the holding stand 31 is parallel to the XY plane and the terminal antenna 1a in the wireless terminal 1 held in the approximately horizontal state on the terminal holding surface is disposed on the X-axis and is disposed at the position closest to the measurement antenna 21 is set as the standard position, the initial coordinates A0 of the terminal antenna 1a become (L, 0, 0). Here, L represents a distance (that is equal to a rotation radius) from the standard point O to the terminal antenna 1a. The antenna position input unit 52 is used for performing an operation input from a user, and includes an input device such as a keyboard, a touch panel, or a mouse.

The error information output unit 60 outputs information on each error at each rotation angle of the wireless terminal 1, which occurs in a case where the position of the terminal antenna 1a is not present at the standard point O, on the basis of the position of the terminal antenna 1a input through the antenna position input unit 52. In this embodiment, the error information output unit 60 includes three error calculation units that calculate errors through computation using the input position of the terminal antenna 1a, that is, a reception angle error calculation unit 61, a propagation loss error calculation unit 62, and a gain error calculation unit 63. The reception angle error calculation unit 61, the propagation loss error calculation unit 62, and the gain error calculation unit 63 are configured in a software form by executing a predetermined program with respect to respective processes thereof.

The reception angle error calculation unit 61 calculates a reception angle error (φ', θ') indicating a deviation of a direction of the terminal antenna 1a seen from the phase center Q of the measurement antenna 21 with respect to a direction of the standard point O seen from the phase center Q of the measurement antenna 21, on the basis of the input initial coordinates A0 of input terminal antenna 1a, at each rotation angle (φ, θ) in the Z-axis and the Y-axis.

Figure 2:
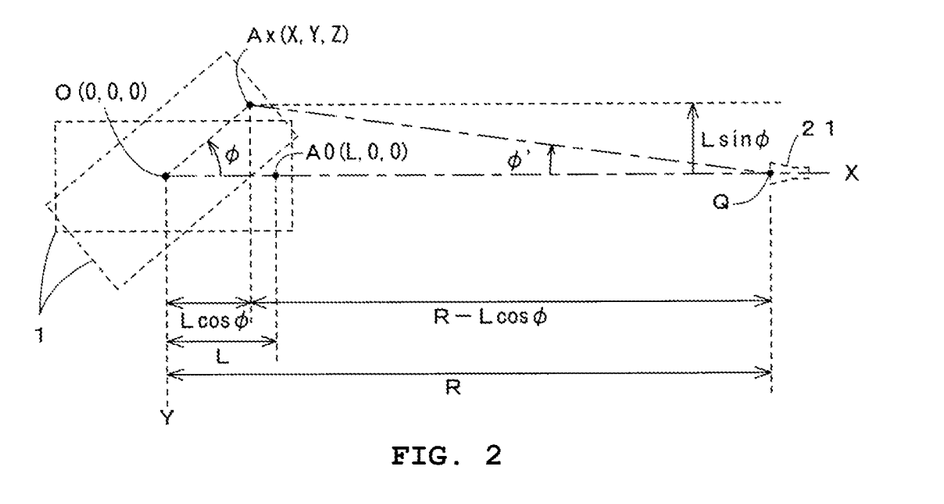
FIG. 2 is a diagram illustrating a reception angle error.

For example, as shown in a simple example in FIG. 2, in a case where the terminal antenna 1a is rotated by the angle φ around the Z-axis from the initial coordinates A0 on the X-axis spaced by the distance L from the standard point O, an angle from coordinates Ax of the terminal antenna 1a after rotation toward the phase center of the measurement antenna 21 becomes an angle φ+φ' obtained by adding $\phi'=\tan^{-1}[L \sin \phi/(R-L \cos \phi)]$ to the rotation angle φ, which is an angle that deviates by φ' with respect to the direction of the standard point O seen from the measurement antenna 21.

Similarly, in a case where the terminal antenna 1a is rotated by the angle θ around the Y-axis, a real direction toward the measurement antenna 21 becomes an angle θ+θ' obtained by adding an error angle θ' to the rotation angle θ.

In a case where the input initial coordinates A0=(X, Y, Z) of the terminal antenna 1a are determined, the error angles θ' and φ' with respect to the rotation angles θ and φ are uniquely calculated using the following coordinate conversion process.

$$\begin{pmatrix} X(\phi, \theta, \psi) \\ Y(\phi, \theta, \psi) \\ Z(\phi, \theta, \psi) \end{pmatrix} = \begin{pmatrix} \cos\phi\cos\theta & \cos\phi\sin\theta\sin\psi - \sin\phi\cos\psi & -\cos\phi\sin\theta\cos\psi - \sin\phi\sin\psi \\ \sin\phi\cos\theta & \sin\phi\sin\theta\sin\psi + \cos\phi\cos\psi & -\sin\phi\sin\theta\cos\psi + \cos\phi\sin\psi \\ \sin\theta & -\cos\theta\sin\psi & \cos\theta\cos\psi \end{pmatrix} \begin{pmatrix} X \\ Y \\ Z \end{pmatrix} \quad \text{[Expression 1]}$$

This coordinate conversion formula also includes the rotation angle $\phi$ around the X-axis, but as in this embodiment, in a case where the rotation is performed around only the Z-axis and the Y-axis, the following coordinate conversion process may be used using $\psi=0$.

$$\begin{pmatrix} X(\phi, \theta) \\ Y(\phi, \theta) \\ Z(\phi, \theta) \end{pmatrix} = \begin{pmatrix} \cos\phi\cos\theta & -\sin\phi & -\cos\phi\sin\theta \\ \sin\phi\cos\theta & \cos\phi & -\sin\phi\sin\theta \\ \sin\theta & 0 & \cos\theta \end{pmatrix} \begin{pmatrix} X \\ Y \\ Z \end{pmatrix} \quad \text{[Expression 2]}$$

Figure 3:
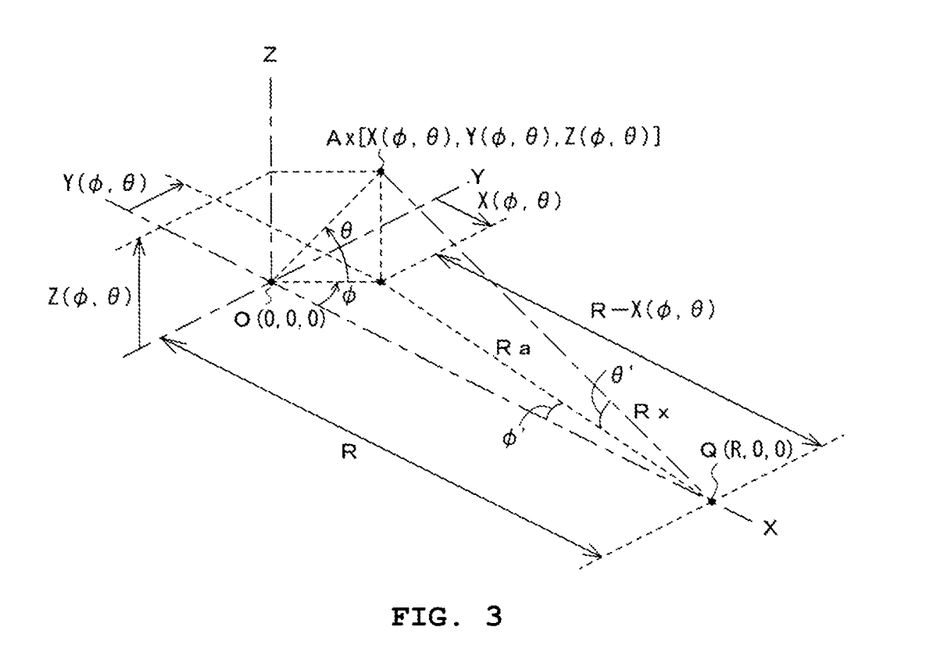
FIG. 3 is a diagram illustrating a propagation loss error and the reception angle error.

For example, as shown in FIG. 3, the reception angle errors $\theta'$ and $\phi'$ calculated by the reception angle error calculation unit 61 in a case where the position of the terminal antenna 1a is rotated by the angle $\phi$ around the Z-axis and by the angle $\theta$ around the Y-axis from the standard position are as follows.

$\theta'=\tan^{-1}[Z(\phi,\theta)/Ra]$ $\phi'=\tan^{-1}\{Y(\phi,\theta)/[R-X(\phi,\theta)]\}$ Here, $Ra=\{Y(\phi,\theta)^2+[R-X(\phi,\theta)]^2\}^{1/2}$ The process is performed to calculate an angle deviation of the direction toward the measurement antenna 21, which accompanies an orbiting movement of the radius L centering around the standard point O of the terminal antenna 1a. In this regard, in association with the orbiting movement of the terminal antenna 1a, it is natural that the distance to the measurement antenna 21 is also changed, and thus, an error occurs in a free space propagation loss due to the distance change with respect to an ideal state in which the terminal antenna 1a is rotated at the position of the standard point O.

The propagation loss error calculation unit 62 calculates a distance Rx from the terminal antenna 1a at each rotation angle of the wireless terminal 1 to the phase center Q of the measurement antenna 21, and calculates a propagation loss error in a free space that occurs due to a difference between the distance Rx and a distance R from the phase center Q of the measurement antenna 21 to the standard point O.

For example, as shown in FIG. 3, the distance Rx between the antennas in a case where the position of the terminal antenna 1a is rotated by the angle $\phi$ around the Z-axis and by the angle $\theta$ around the Y-axis from the initial coordinates expressed as $Rx=[Z(\phi, \theta)^2+Ra^2]^{1/2}$ using the above-described coordinate conversion result.

Accordingly, a propagation loss error $E1(\phi, \theta)$ in a free space may be calculated by $E1(\phi, \theta)=20 \log(R/Rx)$ [dB].

Further, the gain error calculation unit 63 calculates a gain error $E2(\phi, \theta)$ from a maximum gain determined by a deviation angle of the direction toward the measurement antenna 21, which accompanies the orbiting movement of the terminal antenna 1a.

Figure 4:
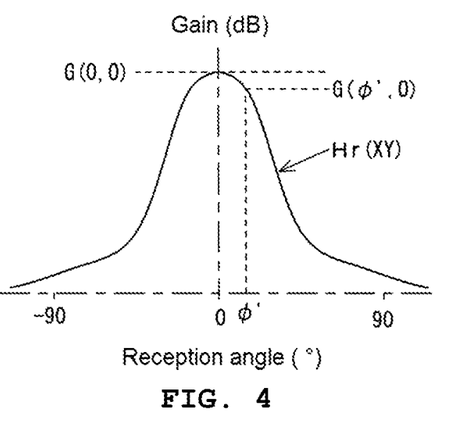
FIG. 4 is a diagram illustrating a gain error of a measurement antenna that accompanies the reception angle error.

In a case where a directional characteristic of $\theta=0$ on the XY plane of the measurement antenna 21 is shown as in Hr(XY) in FIG. 4, the gain error $E2(\phi, \theta)$ may be calculated by a difference between a gain (generally, a maximum gain) G(0, 0) with respect to a radio wave that comes along the X-axis in the case of the ideal state and a gain $G(\phi', 0)$ with respect to a radio wave that actually comes at the deviation angle $\phi'$ with respect to the X-axis. In a case where the rotation angle is extended to two axes, the gain error $E2(\phi, \theta)$ in the case of the deviation angle $\phi'$ around the Z-axis and the deviation angle $\theta'$ around the Y-axis may be calculated by computation of $E2(\phi, \theta)=G(\phi', \theta')-G(0, 0)$ using a gain $G(\phi', \theta')$ of the measurement antenna in the case of incidence angles $\phi'$ and $\theta'$.

The correction unit 70 corrects the virtual directional characteristic $Ha(\phi, \theta)$ obtained by the directional characteristic acquisition unit 51 using the reception angle error $(\phi', \theta')$, the propagation loss error $E1(\phi, \theta)$, and the gain error $E2(\phi, \theta)$ at each rotation angle output from the error information output unit 60 to calculate a directional characteristic (a desired true directional characteristic) $Hc(\phi, \theta)$ in a case where it is assumed that the terminal antenna 1a is rotated centering around the standard point O at the position of the standard point O. The correction unit is configured in a software form by executing a predetermined program.

That is, the directional characteristic $Ha(\phi, \theta)$ obtained at each rotation angle $(\phi, \theta)$ is a directional characteristic in a case where a real angle is $(\phi+\phi', \theta+\theta')$, in which the free space propagation loss error of $E1(\phi, \theta)$ is included due to the distance change between antennas and the gain error of $E2(\phi, \theta)$ is included due to the deviation of the rotation angle. Accordingly, the true directional characteristic $Hc(\phi, \theta)$ is obtained by correcting the errors of $E1(\phi, \theta)$ and $E2(\phi, \theta)$ in the direction of the field intensity with respect to the virtual directional characteristic $Ha(\phi, \theta)$ obtained in measurement and by additionally correcting the reception angle error $(\phi', \theta')$ in the angle direction.

By performing this correction with respect to measurement values at each of all rotation angles, it is possible to calculate a true directional characteristic in all directions in a case where it is assumed that the terminal antenna 1a is rotated at the position of the standard point O.

Figure 5A:
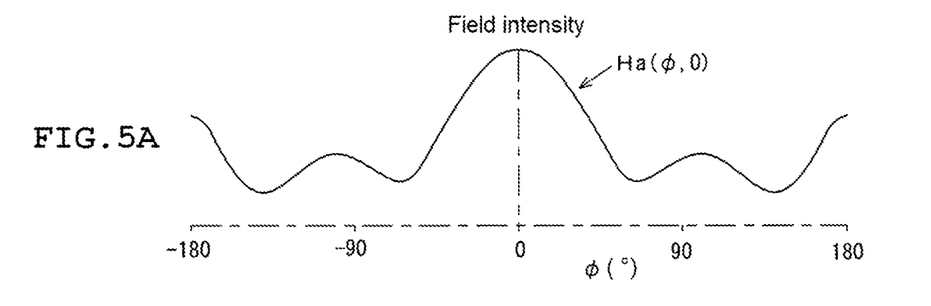
FIGS. 5A to 5E are diagrams showing processes of main units according to the embodiment.
Figure 5B:
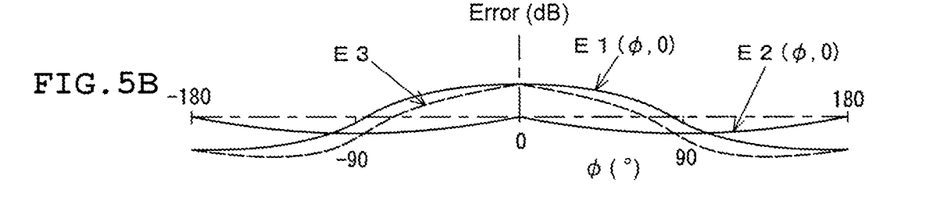
Figure 5C:
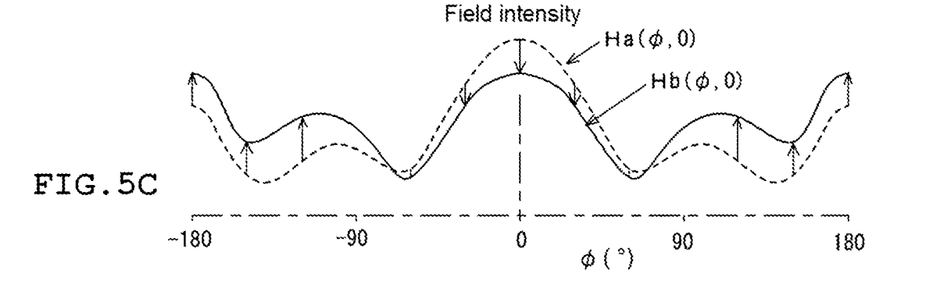

For example, it is assumed that a virtual directional characteristic $Ha(\phi, 0)$ shown in FIG. 5A is obtained in a case where the rotation is performed in a range of $\theta=0$ and $\phi=0°\pm180°$. With respect to a change of the rotation angle $\phi$, as in FIG. 5B, a propagation loss error $E1(\phi, \theta)$ becomes a positive maximum value in a case where $\phi$ is 0° and becomes a negative minimum value in a case where $\phi$ is 180°, and a gain error $E2(\phi, \theta)$ become zero in a case where $\phi$ is 0° and ±180° and becomes a negative minimum value in a range of 0° to ±90°. Further, an error characteristic in the field intensity direction obtained by adding the propagation loss error $E1(\phi, \theta)$ and the gain error $E2(\phi, \theta)$ becomes E3. As shown in FIG. 5C, in a case where the virtual directional characteristic $Ha(\phi, 0)$ indicated by a dashed line is corrected using the error characteristic E3, a directional characteristic $Hb(\phi, 0)$ indicated by a solid line is obtained.

Figure 5D:
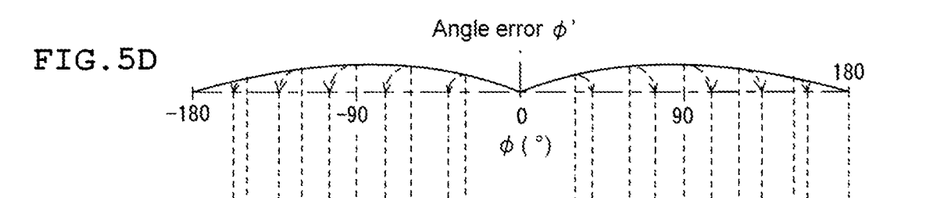
Figure 5E:
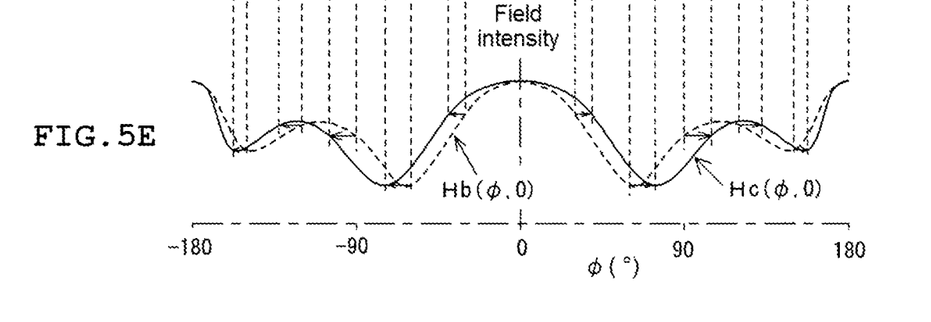

Further, since the reception angle error becomes zero in a case where $\phi$ is 0° and ±180°, as shown in FIG. 5D, and becomes a positive maximum value in a range of 0° to ±90° respectively, the angle of the directional characteristic $Hb(\phi, 0)$ is corrected by the reception angle error $\phi'$. That is, as shown in FIG. 5E, in a case where correction for shifting the field intensity $Pr(\phi, 0)$ measured at the angle to a position of an angle $\phi+\phi'$ is performed, a directional characteristic $Hc(\phi, 0)$ in which the field intensity at each angle $\phi$ shifts to an angle position of ϕ+ϕ', indicated by a solid line, is obtained. The directional characteristic Hc(ϕ, 0) becomes a desired true directional characteristic in a case where it is assumed that the terminal antenna 1a is rotated around the Z-axis in a range of ±180° at the position of the standard point O.

As described above, the measurement system 20 of this embodiment is configured so that the wireless terminal 1 that is a measurement target is rotated centering around the standard point O, a field intensity (the intensity of a radio wave) is measured from a reception signal of the measurement antenna 21 at each rotation angle to calculate a virtual directional characteristic of the terminal antenna 1a in the wireless terminal, and the virtual directional characteristic is corrected using a reception angle error, a propagation loss error, and a gain error that occur in accordance with the rotation of the wireless terminal 1 to calculate a directional characteristic in a case where it is assumed that the terminal antenna 1a of the wireless terminal 1 is rotated at the position of the standard point O.

Thus, even in a case where distance between the wireless terminal 1 that is a test target and the measurement antenna 21 is a relatively short distance in which a far field measurement condition is satisfied and a propagation loss therebetween does not become large, it is possible to accurately measure directional characteristic without influence on measurement due to deviation of the position of the terminal antenna 1a from a rotation center. In a case where a distance between the position of the terminal antenna 1a and the standard point O in a case where the wireless terminal 1 is disposed at the standard position is zero or is sufficiently short compared with the distance R from the measurement antenna 21 to the standard point O, it is possible to use a virtual directional characteristic as a true directional characteristic without correcting the virtual directional characteristic.

In the above-described embodiment, in measurement space, a reception angle error, a propagation loss error, and a gain error at each rotation angle are calculated through computational processing using an input value of coordinates for specifying the position of the terminal antenna 1a, and a virtual directional characteristic is corrected using these errors, but a configuration in which a plurality of candidate positions capable of becoming the position of the terminal antenna in a case where the wireless terminal that is the measurement target candidate is disposed at the standard position are set in the measurement space; the reception angle error, the propagation loss error, and the gain error are calculated at each rotation angle of the wireless terminal with respect to each of the plurality of candidate positions and are stored in advance; in a case where the position of a terminal antenna of a wireless terminal that is a real measurement target is input, the reception angle error, the propagation loss error, and the gain error that are stored in advance with respect to a candidate position corresponding to the input position are read out; and a virtual directional characteristic is corrected using these errors, may be used.

Figure 6:
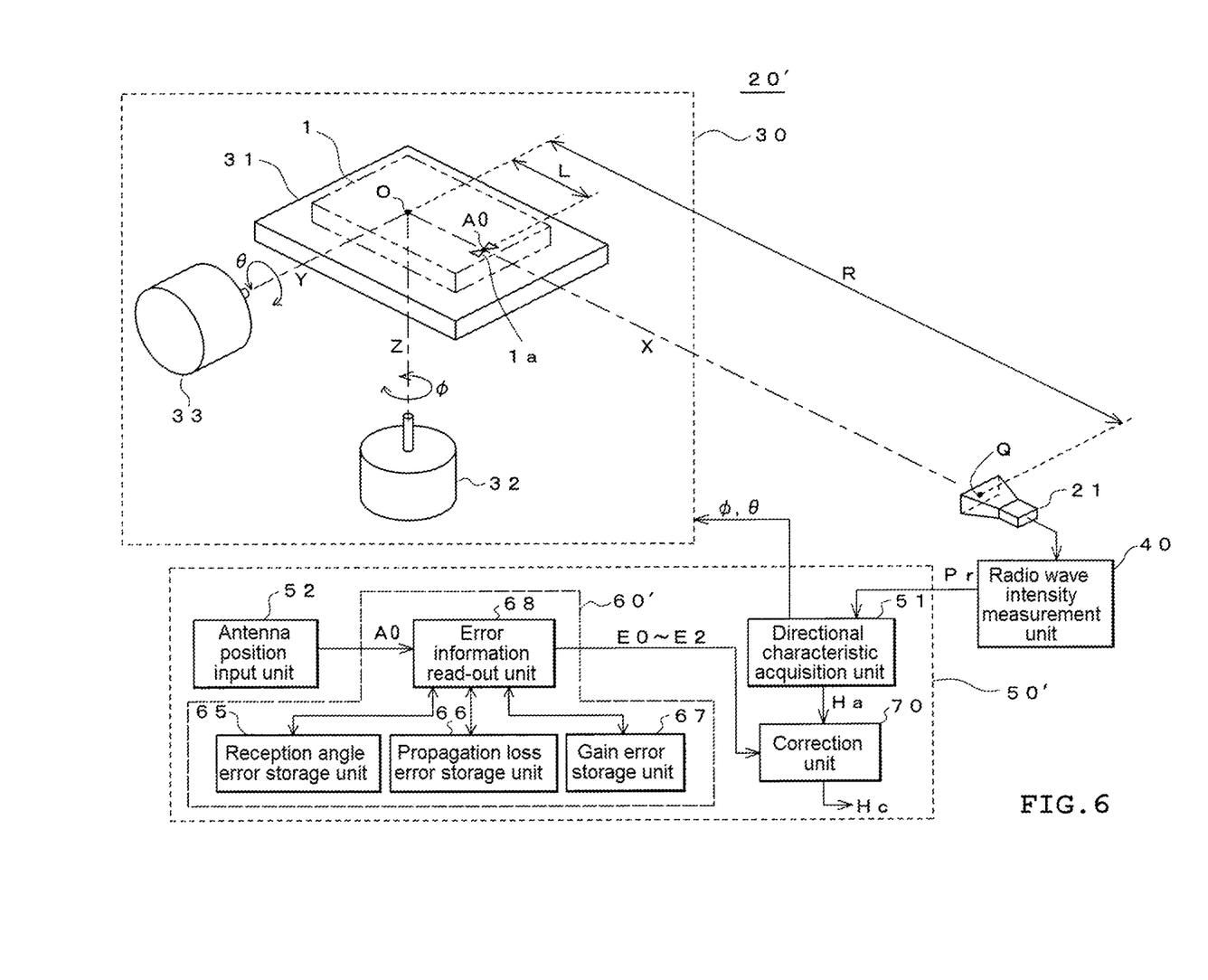
FIG. 6 is an overall configuration diagram according to another embodiment of the invention.

FIG. 6 shows a configuration of a measurement system 20' of another embodiment, which is different from the measurement system 20 of the above-described embodiment in terms of a configuration of a computational processing unit 50'.

That is, the computational processing unit 50' includes the directional characteristic acquisition unit 51, the antenna position input unit 52, an error information output unit 60', and the correction unit 70, in a similar way to the above description, but the error information output unit 60' includes a reception angle error storage unit 65, a propagation loss error storage unit 66, a gain error storage unit 67, and an error information read-out unit 68. The computational processing unit 50', the error information output unit 60', and the error information read-out unit 68 are configured in a software form by executing a predetermined program with respect to respective processes thereof. The reception angle error storage unit 65, the propagation loss error storage unit 66, and the gain error storage unit 67 may be memories that are built in the antenna directional characteristic measurement system 20', or may be storage mediums capable of being extracted from the antenna directional characteristic measurement system 20'.

The reception angle error storage unit 65 stores in advance, in a state where sets of coordinates A1, A2, and, of a plurality of candidate positions capable of becoming the position of a terminal antenna in a case where a wireless terminal that is a measurement target candidate is disposed at a standard position are set in a measurement space represented by an orthogonal coordinate system in which a standard point O is the origin as described above, a reception angle error (ϕ', θ') indicating a deviation in a direction of the terminal antenna 1a seen from the phase center Q of the measurement antenna 21 with respect to a standard direction, with respect to each set of the coordinates A1, A2, and, . . . of the plurality of candidate positions, in which the standard direction is a direction of the standard point O seen from the phase center Q of the measurement antenna 21, at each rotation angle (ϕ, θ) of the wireless terminal 1.

Here, the sets of coordinates A1, A2, and, . . . of the candidate positions may be arbitrary coordinates set in a sphere having a predetermined radius Lmax centering around the standard point O, and the radius Lmax may be equal to or shorter than a distance from the standard point to a most distant terminal antenna in a case where the wireless terminal that is a measurement candidate is disposed at the standard position. Here, in reality, the standard position where the wireless terminal 1 is held is set so that the display operating surface of the wireless terminal 1 is parallel to any one of the XY plane, the YZ plane, and the XZ plane, in many cases, and thus, a probability that the terminal antenna of the wireless terminal 1 is disposed on either axis of X, Y, or Z or in a region in the vicinity thereof is high. Thus, only positions of coordinates included in the region may be set as candidates.

Similarly, in the propagation loss error storage unit 66, a propagation loss error $E1(\phi, \theta)$ in a free space that occurs due to a difference between the distance R from the phase center Q of the measurement antenna 21 to the standard point O and the distance Rx from the phase center Q of the measurement antenna 21 to the terminal antenna 1a is stored in advance at each rotation angle (ϕ, θ), with respect to each set of the coordinates A1, A2, and, . . . of the plurality of candidate positions. In the gain error storage unit 67, a gain error $E2(\phi, \theta)$ of the measurement antenna 21 calculated using the reception angle error (ϕ', θ') and the directional characteristic Hr of the measurement antenna 21 with respect to each set of the sets of coordinates A1, A2, and, . . . of the plurality of candidate positions is stored in advance at each rotation angle (ϕ, θ).

Figure 7:
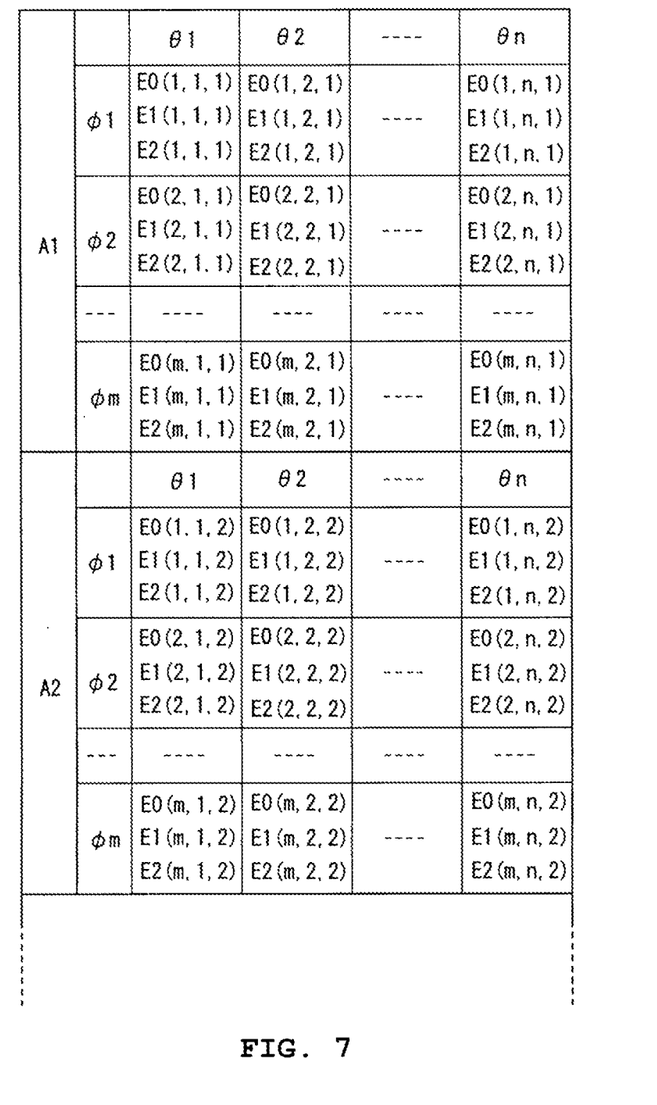
FIG. 7 is a diagram showing a data storage example of main units according to the other embodiment of the invention.

FIG. 7 shows an example of respective errors calculated at each rotation angle with respect to the sets of coordinates A1, A2, and, . . . of the plurality of candidate positions. In FIG. 7, it is assumed that an error E0 (i, j, k) represents a set of reception angle errors ϕ' and θ' at a rotation angle (ϕi, θj) with respect to coordinates Ak of a k-th candidate position.

Further, errors E1(i, j, k) and E2(i, j, k) represent a propagation loss error and a gain error at coordinates of each candidate position.

The error information read-out unit 68 reads a reception angle error E0, a propagation loss error E1, and a gain error E2 that are stored in advance in the reception angle error storage unit 65, the propagation loss error storage unit 66, and the gain error storage unit 67 with respect to the coordinates Ak of the candidate position corresponding to a position input through the antenna position input unit 52 among the sets of coordinates A1, A2, and, of the plurality of candidate positions, and provides the result to the correction unit 70. The correction unit 70 corrects a virtual directional characteristic Ha of the terminal antenna 1a using the respective errors E0 to E2, in a similar way to the above-described embodiment, and calculates a directional characteristic Hc in a case where it is assumed that the terminal antenna 1a is rotated at the position of the standard point O.

In the case of this embodiment, since error information at each rotation angle necessary for correction is stored in advance with respect to each of the candidate positions, in a state where a virtual directional characteristic is obtained through measurement and the position of a terminal antenna is input, it is possible to immediately perform a correction computation, and thus, it is possible to efficiently calculate a true directional characteristic.

In a case where a set resolution of coordinates of a candidate position is equal to a resolution of a coordinate input value of the position of a terminal antenna, an error that is stored in advance may be read out with respect to the candidate position having the same resolution as that of the coordinate input value. Further, in a case where the set resolution of the coordinates of the candidate position is larger than the resolution of the coordinate input value of the position of the terminal antenna, an error that is stored in advance may be read out with respect to a candidate position having a resolution closest to that of the coordinate input value. In this case, the accuracy of each error is slightly lowered, but the number of set candidate positions becomes small, and thus, it is possible to reduce a storage capacity necessary for storage of errors.

Further, a configuration in which the respective error storage units 65, 66 and 67 and the error information read-out unit 68 are provided in the computational processing unit 50 of the measurement system 20 in FIG. 1, a determination unit (not shown) determines whether an input position of a terminal antenna is new or registered, and in a case where the input position is registered in the respective error storage units 65, 66 and 67, error information corresponding to its coordinates is read out by the error information read-out unit 68 and is given to the correction unit 70 to correct a virtual directional characteristic, may be used. In this configuration, in a case where the input position is new, respective errors are newly calculated by the respective error calculation units 61, 62 and 63 and are given to the correction unit 70 to correct the virtual directional characteristic, and the newly calculated errors and the input position of the terminal antenna (new candidate position) are newly registered in association in the respective error storage units 65, 66 and 67 using a registration unit (not shown), so that values stored in the respective error storage units 65, 66 and 67 are sequentially added. The error information read-out unit 68, the determination unit, and the registration unit may be configured in a software form by executing a predetermined program with respect to respective processes thereof.

DESCRIPTION OF REFERENCE NUMERALS AND SIGNS 20, 20': antenna directional characteristic measurement system
21: measurement antenna
30: terminal holding rotation mechanism
40: radio wave intensity measurement unit
50, 50': computational processing unit
51: directional characteristic acquisition unit
52: antenna position input unit
60, 60': error information output unit
61: reception angle error calculation unit
62: propagation loss error calculation unit
63: gain error calculation unit
65: reception angle error storage unit
66: propagation loss error storage unit
67: gain error storage unit
68: error information read-out unit
70: correction unit

What is claimed is:

1. A wireless terminal antenna directional characteristic measurement system comprising:
a measurement antenna having a known directional characteristic, which is fixed at a predetermined position in a measurement space in which entrance of a radio wave from the outside and internal reflection of the radio wave are suppressed;
a terminal holding rotation mechanism that holds, using a point spaced from a phase center of the measurement antenna by a predetermined distance as a standard point, a wireless terminal that is a measurement target in a vicinity of the standard point, and rotates the held wireless terminal centering around the standard point within a region where a distance condition of far field measurement is satisfied from the measurement antenna, in the measurement space;
a radio wave intensity measurement unit that measures a field intensity or power of a radio wave received by the measurement antenna with respect to a radio wave output from a terminal antenna in the wireless terminal held by the terminal holding rotation mechanism;
a directional characteristic acquisition unit that rotates the wireless terminal from a standard position by controlling the terminal holding rotation mechanism and acquires a virtual directional characteristic of the terminal antenna from a measurement value obtained by the radio wave intensity measurement unit at each rotation angle;
an antenna position input unit through which the position of the terminal antenna in a case where the wireless terminal is disposed in the standard position, in the measurement space, is input;
an error information output unit that outputs a reception angle error at each rotation angle of the wireless terminal indicating a deviation between a direction of the standard point and a direction of the terminal antenna from the phase center of the measurement antenna, a propagation loss error in a free space at each rotation angle of the wireless terminal, which occurs due to a difference between a distance to the standard point from the phase center of the measurement antenna and a distance to the terminal antenna, and a gain error of the measurement antenna at each rotation angle of the wireless terminal, which is determined by the reception angle error and the directional characteristic of the measurement antenna, on the basis of the input position of the terminal antenna; and a correction unit that corrects the virtual directional characteristic of the terminal antenna using the reception angle error, the propagation loss error, and the gain error at each rotation angle of the wireless terminal output from the error information output unit to calculate a directional characteristic in a case where it is assumed that the terminal antenna is rotated at the position of the standard point.

2. The wireless terminal antenna directional characteristic measurement system according to claim 1, wherein the error information output unit includes a reception angle error calculation unit that calculates the reception angle error at each rotation angle of the wireless terminal on the basis of the input position of the terminal antenna, a propagation loss error calculation unit that calculates the propagation loss error in the free space at each rotation angle of the wireless terminal on the basis of the input position of the terminal antenna, and a gain error calculation unit that calculates the gain error of the measurement antenna at each rotation angle of the wireless terminal from the reception angle error at each rotation angle of the wireless terminal calculated by the reception angle error calculation unit and the directional characteristic of the measurement antenna.

3. The wireless terminal antenna directional characteristic measurement system according to claim 1, wherein the error information output unit includes a reception angle error storage unit that stores, in a state where a plurality of candidate positions capable of becoming the position of the terminal antenna in a case where the wireless terminal that is the measurement target candidate is disposed at the standard position are set in the measurement space, the reception angle error at each rotation angle of the wireless terminal that is calculated in advance with respect to each of the plurality of candidate positions, a propagation loss error storage unit that stores the propagation loss error in the free space at each rotation angle of the wireless terminal that is calculated in advance, with respect to each of the plurality of candidate positions, a gain error storage unit that stores the gain error of the measurement antenna at each rotation angle of the wireless terminal that is calculated in advance using the reception angle error stored in the reception angle error storage unit and the directional characteristic of the measurement antenna with respect to each of the plurality of candidate positions, and an error information read-out unit that reads out the reception angle error, the propagation loss error, and the gain error at each rotation angle of the wireless terminal that are stored in advance in the reception angle error storage unit, the propagation loss error storage unit, and the gain error storage unit with respect to a candidate position corresponding to the position input through the antenna position input unit among the plurality of candidate positions, and provides the result to the correction unit.

4. The wireless terminal antenna directional characteristic measurement system according to claim 1, wherein the phase center is a point that is virtually considered as a concentration point of a radio wave in emission and incidence of the radio wave.

5. The wireless terminal antenna directional characteristic measurement system according to claim 2, wherein the direction of the standard point from the phase center of the measurement antenna is set as an X-axis direction, wherein the antenna position input unit inputs initial coordinates (X, Y, Z) for specifying the position of the terminal antenna represented by an orthogonal coordinate system of X-axis, Y-axis, and Z-axis with the standard point as an origin, and wherein the directional characteristic acquisition unit controls the terminal holding rotation mechanism to rotate the wireless terminal about the Y-axis from the standard position by a rotation angle θ and a rotation angle φ about the Z-axis and the position coordinate of the antenna after rotation is expressed by Expression 1:

$$\begin{pmatrix} X(\phi,\theta) \\ Y(\phi,\theta) \\ Z(\phi,\theta) \end{pmatrix} = \begin{pmatrix} \cos\phi\cos\theta & -\sin\phi & -\cos\phi\sin\theta \\ \sin\phi\cos\theta & \cos\phi & -\sin\phi\sin\theta \\ \sin\theta & 0 & \cos\theta \end{pmatrix} \begin{pmatrix} X \\ Y \\ Z \end{pmatrix}. \quad [\text{Expression 1}]$$

6. The wireless terminal antenna directional characteristic measurement system according to claim 5, wherein the reception angle error calculation unit calculates reception angle errors θ' and φ' for each rotation angle of the wireless terminal representing a deviation between the direction of the reference point from the phase center of the measurement antenna and the direction of the terminal antenna as follows:

$\theta' = \tan^{-1}[Z(\phi,\theta)/Ra]$ $\phi' = \tan^{-1}\{Y(\phi,\theta)/[R-X(\phi,\theta)]\}$ $Ra = \{Y(\phi,\theta)^2 + [R-X(\phi,\theta)]^2\}^{1/2}$.

7. The wireless terminal antenna directional characteristic measurement system according to claim 6, wherein the propagation loss error calculation unit obtains a distance $Rx = [Z(\phi,\theta)^2 + Ra^2]^{1/2}$ from the terminal antenna for each rotation angle to the phase center of the measurement antenna to calculate a propagation loss error $E1(\phi,\theta) = 20\log(R/Rx)$ [dB] in a free space caused by the difference between the distance Rx and the distance R from the phase center Q of the measurement antenna to the standard point.

8. The wireless terminal antenna directional characteristic measurement system according to claim 7, wherein the gain error calculation unit calculates a gain error $E2(\phi',\theta') = G(\phi',\theta') - G(0,0)$ of the measurement antenna, where a gain G (0, 0) with respect to a radio wave that comes along the X-axis is defined as G(0, 0), and a gain of the measurement antenna for the radio wave incident at φ', θ' is defined as G (φ', θ'), wherein φ' and θ' are the reception angle errors stored in the reception angle error storage unit from the terminal antenna.

9. The wireless terminal antenna directional characteristic measurement system according to claim 8, wherein the correction unit corrects the propagation loss error in the free space and the gain error of the measurement antenna in the electric field strength direction with respect to a provisional directional characteristic of the terminal antenna, and further corrects the reception angle error ϕ', θ' in an angular direction.

10. The wireless terminal antenna directional characteristic measurement system according to claim 3,
wherein a direction of the standard point from the phase center of the measurement antenna is set as an X-axis direction,
wherein the antenna position input unit inputs initial coordinates (X, Y, Z) for specifying the position of the terminal antenna represented by an orthogonal coordinate system of X-axis, Y-axis, and Z-axis with the standard point as an origin, and
wherein the directional characteristic acquisition unit controls the terminal holding rotation mechanism to rotate the wireless terminal about the Y-axis from the standard position by a rotation angle θ and a rotation angle ϕ about the Z-axis and the position coordinate of the antenna after rotation is expressed by Expression 1:

$$\begin{pmatrix} X(\phi,\theta) \\ Y(\phi,\theta) \\ Z(\phi,\theta) \end{pmatrix} = \begin{pmatrix} \cos\phi\cos\theta & -\sin\phi & -\cos\phi\sin\theta \\ \sin\phi\cos\theta & \cos\phi & -\sin\phi\sin\theta \\ \sin\theta & 0 & \cos\theta \end{pmatrix} \begin{pmatrix} X \\ Y \\ Z \end{pmatrix}. \quad \text{[Expression 1]}$$

11. The wireless terminal antenna directional characteristic measurement system according to claim 10,
wherein the reception angle error storage unit obtains, for each of the plurality of candidate positions, reception angle errors θ' and ϕ' for each rotation angle of the wireless terminal representing a deviation between the direction of the standard point from the phase center of the measurement antenna and the direction of the terminal antenna as following expressions, in advance to store the reception angle error:

$$\theta'=\tan^{-1}[Z(\phi,\theta)/Ra]$$

$$\phi'=\tan^{-1}\{Y(\phi,\theta)/[R-X(\phi,\theta)]\}$$

$$Ra=\{Y(\phi,\theta)^2+[R-X(\phi,\theta)]^2\}^{1/2}.$$

12. The wireless terminal antenna directional characteristic measurement system according to claim 11,
wherein the propagation loss error calculation unit obtains, for each of the plurality of candidate positions, a distance $Rx=[Z(\phi,\theta)^2+Ra^2]^{1/2}$ from the terminal antenna for each rotation angle to the phase center of the measurement antenna, and obtains a propagation loss error $E1(\phi,\theta)=20\log(R/Rx)$ [dB] in a free space caused by the difference between the distance Rx and the distance R from the phase center Q of the measurement antenna to the standard point to store the propagation loss error.

13. The wireless terminal antenna directional characteristic measurement system according to claim 12,
wherein the gain error storage unit calculates, for each of the plurality of candidate positions, a gain error $E2(\phi',\theta')=G(\phi',\theta')-G(0,0)$ of the measuring antenna, where a gain G (0, 0) with respect to a radio wave that comes along the X-axis is defined as G(0, 0), and a directional characteristic of the terminal antenna with respect to the radio wave incident at ϕ',θ' is defined as G (ϕ', θ') to store the gain error, wherein ϕ' and θ' are the reception angle errors stored in the reception angle error storage unit from the terminal antenna.

14. The wireless terminal antenna directional characteristic measurement system according to claim 13, wherein the correction unit corrects a propagation loss error in the free space and a gain error of the measurement antenna in the electric field strength direction with respect to a provisional directional characteristic of the terminal antenna, and further corrects the reception angle error ϕ', θ' in an angular direction.

15. A wireless terminal antenna directional characteristic measurement method comprising:
a step of rotating, using a point spaced by a predetermined distance from a phase center of a measurement antenna having a known directional characteristic, which is fixed at a predetermined position in a measurement space in which entrance of a radio wave from the outside and internal reflection of the radio wave are suppressed, as a standard point, a wireless terminal that is a measurement target held in the vicinity of the standard point centering around the standard point from a standard position within a region where a distance condition of far field measurement is satisfied from the measurement antenna, and measuring a field intensity or power of a radio wave received by the measurement antenna with respect to the radio wave output from a terminal antenna in the wireless terminal at each rotation angle to acquire a virtual directional characteristic of the terminal antenna;
a step of inputting the position of the terminal antenna in a case where the wireless terminal is disposed in the standard position, in the measurement space;
a step of outputting respective errors including a reception angle error at each rotation angle of the wireless terminal indicating a deviation between a direction of the standard point and a direction of the terminal antenna from the phase center of the measurement antenna, a propagation loss error in a free space at each rotation angle of the wireless terminal, which occurs due to a difference between a distance to the standard point from the phase center of the measurement antenna and a distance to the terminal antenna, and a gain error of the measurement antenna at each rotation angle of the wireless terminal, which is determined by the reception angle error and the directional characteristic of the measurement antenna, on the basis of the input position of the terminal antenna; and
a step of correcting the virtual directional characteristic of the terminal antenna using the output reception angle error, propagation loss error, and gain error at each rotation angle of the wireless terminal to calculate a directional characteristic in a case where it is assumed that the terminal antenna is rotated at the position of the standard point.

16. The wireless terminal antenna directional characteristic measurement method according to claim 15,
wherein the step of outputting the respective errors includes calculating the reception angle error, the propagation loss error, and the gain error at each rotation angle of the wireless terminal by computation using the input position of the terminal antenna.

17. The wireless terminal antenna directional characteristic measurement method according to claim 15, further comprising:
a step of setting a plurality of candidate positions capable of becoming the position of the terminal antenna in a case where the wireless terminal that is the measurement target candidate is disposed at the standard position in the measurement space, and calculating and storing in advance the reception angle error, the propagation loss error in the free space, and the gain error of the measurement antenna at each rotation angle of the wireless terminal with respect to each of the plurality of candidate positions, wherein the step of outputting the respective errors includes reading out the reception angle error, the propagation loss error, and the gain error that are stored in advance with respect to a candidate position corresponding to the input position of the terminal antenna among the plurality of candidate positions.

18. The wireless terminal antenna directional characteristic measurement method according to claim 15, wherein a direction of the standard point from the phase center of the measurement antenna is set as an X-axis direction, wherein the step of inputting a position of the terminal antenna inputs initial coordinates (X, Y, Z) for specifying the position of the terminal antenna represented by an orthogonal coordinate system of X-axis, Y-axis, and Z-axis with the standard point as an origin, wherein the directional characteristic acquiring step controls the terminal holding rotation mechanism to rotate the wireless terminal about the Y-axis from the standard position by a rotation angle $\theta$ and a rotation angle $\phi$ about the Z-axis and the position coordinate of the antenna after rotation is expressed by Expression 1, $$\begin{pmatrix} X(\phi,\theta) \\ Y(\phi,\theta) \\ Z(\phi,\theta) \end{pmatrix} = \begin{pmatrix} \cos\phi\cos\theta & -\sin\phi & -\cos\phi\sin\theta \\ \sin\phi\cos\theta & \cos\phi & -\sin\phi\sin\theta \\ \sin\theta & 0 & \cos\theta \end{pmatrix} \begin{pmatrix} X \\ Y \\ Z \end{pmatrix} \quad \text{[Expression 1]}$$

wherein the step of calculating the reception angle error calculates reception angle errors $\theta'$ and $\phi'$ for each rotation angle of the wireless terminal representing a deviation between the direction of the reference point from the phase center of the measurement antenna and the direction of the terminal antenna as follows:

$\theta' = \tan^{-1}[Z(\phi,\theta)/Ra]$ $\phi' = \tan^{-1}\{Y(\phi,\theta)/[R-X(\phi,\theta)]\}$ $Ra = \{Y(\phi,\theta)^2 + [R-X(\phi,\theta)]^2\}^{1/2}$, wherein the step of calculating the propagation loss error obtains a distance $Rx = [Z(\phi,\theta)^2 + Ra^2]^{1/2}$ from the terminal antenna for each rotation angle to the phase center of the measurement antenna to calculate a propagation loss error $E1(\phi,\theta) = 20\log(R/Rx)$ [dB] in a free space caused by the difference between the distance Rx and the distance R from the phase center Q of the measurement antenna to the standard point, wherein the step of calculating the gain error calculates a gain error $E2(\phi',\theta') = G(\phi',\theta') - G(0,0)$ of the measuring antenna, where a gain G (0, 0) with respect to a radio wave that comes along the X-axis is defined as G(0, 0), and a gain of the measurement antenna for the radio wave incident at $\phi',\theta'$ is defined as G ($\phi',\theta'$), wherein $\phi'$ and $\theta'$ are the reception angle errors from the terminal antenna after rotation, and wherein the step of obtaining a directional characteristic when it is assumed that the terminal antenna is rotated at the position of the standard point corrects a propagation loss error in the free space and a gain error of the measurement antenna with respect to a provisional directional characteristic of the terminal antenna, and further corrects the reception angle error $\phi',\theta'$ in an angular direction.

19. The wireless terminal antenna directional characteristic measurement method according to claim 17, wherein a direction of the standard point from the phase center of the measurement antenna is set as an X-axis direction, wherein the step of inputting a position of the terminal antenna inputs initial coordinates (X, Y, Z) for specifying the position of the terminal antenna represented by an orthogonal coordinate system of X-axis, Y-axis, and Z-axis with the standard point as an origin, wherein the directional characteristic acquiring step controls the terminal holding rotation mechanism to rotate the wireless terminal about the Y-axis from the standard position by a rotation angle $\theta$ and a rotation angle $\phi$ about the Z-axis and the position coordinate of the antenna after rotation is expressed by Expression 1,

[Expression 1]

wherein the step of storing the reception angle error in advance calculates, for each of a plurality of candidate positions, reception angle errors $\theta'$ and $\phi'$ for each rotation angle of the wireless terminal representing a deviation between the direction of the reference point from the phase center of the measurement antenna and the direction of the terminal antenna as following expressions, in advance, $\theta' = \tan^{-1}[Z(\phi,\theta)/Ra]$ $\phi' = \tan^{-1}\{Y(\phi,\theta)/[R-X(\phi,\theta)]\}$ $Ra = \{Y(\phi,\theta)^2 + [R-X(\phi,\theta)]^2\}^{1/2}$, wherein the step of storing the propagation loss error in advance obtains, for each of a plurality of candidate positions, a distance $Rx = [Z(\phi,\theta)^2 + Ra^2]^{1/2}$ from the terminal antenna for each rotation angle to the phase center of the measurement antenna to store a propagation loss error $E1(\phi,\theta) = 20\log(R/Rx)$ [dB] in a free space caused by the difference between the distance Rx and the distance R from the phase center Q of the measurement antenna to the standard point in advance, wherein the step of storing the gain error in advance stores, for each of a plurality of candidate positions, a gain error $E2(\phi',\theta') = G(\phi',\theta') - G(0,0)$ of the measuring antenna, in advance where a gain G(0, 0) with respect to a radio wave that comes along the X-axis is defined as G(0, 0), and a gain of the measurement antenna for the radio wave incident at $\phi',\theta'$ is defined as G ($\phi',\theta'$), wherein $\phi'$ and $\theta'$ are the reception angle errors from the terminal antenna after rotation after rotation and wherein the step of obtaining a directional characteristic when it is assumed that the terminal antenna is rotated at the position of the standard point corrects a propagation loss error in the free space and a gain error of the measurement antenna in the electric field strength direction with respect to a provisional directional characteristic of the terminal antenna, and further corrects the reception angle error $\phi',\theta'$ in an angular direction.

* * * * *